(12) United States Patent
Sweeney et al.

(10) Patent No.: US 10,073,600 B1
(45) Date of Patent: Sep. 11, 2018

(54) SELECTING LARGE AND SMALL ENTITIES ON A COMPUTER DISPLAY

(71) Applicant: Dassault Systemes SolidWorks Corporation, Waltham, MA (US)

(72) Inventors: John Sweeney, Acton, MA (US); Bruce W. Holway, Concord, MA (US); Rajesh Mahajan, Pune (IN); Kevin F. Berni, Lowell, MA (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 256 days.

(21) Appl. No.: 14/861,760

(22) Filed: Sep. 22, 2015

Related U.S. Application Data

(60) Provisional application No. 62/095,342, filed on Dec. 22, 2014.

(51) Int. Cl.
| | |
|---|---|
| *G06F 3/048* | (2013.01) |
| *G06F 3/0484* | (2013.01) |
| *G06F 3/0481* | (2013.01) |
| *G06F 3/0488* | (2013.01) |
| *G06F 3/01* | (2006.01) |

(52) U.S. Cl.
CPC ........ *G06F 3/04845* (2013.01); *G06F 3/0481* (2013.01); *G06F 3/0488* (2013.01); *G06F 3/04812* (2013.01); *G06F 3/04815* (2013.01); *G06F 3/04842* (2013.01)

(58) Field of Classification Search
CPC .............. G06F 3/04845; G06F 3/0481; G06F 3/04812; G06F 3/04815
See application file for complete search history.

(56) References Cited

U.S. PATENT DOCUMENTS

| | | | | |
|---|---|---|---|---|
| 5,528,330 | A * | 6/1996 | Utagawa ................ | G02B 7/346 250/201.2 |
| 5,757,358 | A * | 5/1998 | Osga ................... | G06F 3/04842 345/157 |
| 6,095,650 | A * | 8/2000 | Gao ..................... | G02C 13/005 351/227 |
| 7,277,572 | B2 * | 10/2007 | MacInnes ........... | G06F 17/5004 345/419 |
| 7,694,238 | B2 | 4/2010 | Gibson et al. | |
| 2002/0097270 | A1 * | 7/2002 | Keely .................. | G06F 3/0481 715/764 |
| 2011/0043517 | A1 * | 2/2011 | Schneider ............. | G06F 17/50 345/419 |
| 2012/0005624 | A1 * | 1/2012 | Vesely ................. | G06F 3/012 715/808 |

(Continued)

*Primary Examiner* — Nicholas Augustine
(74) *Attorney, Agent, or Firm* — Hamilton, Brook, Smith & Reynolds, P.C.

(57) ABSTRACT

A computer-implemented method and system automatically adjusts the size of a selection area to aid in a selection of an object generated by a computerized system. The method and system detect a series of movements of a pointer, where the pointer is utilized to select an entity of the object. The series of movements are small and continuous. A set of entities that occupies the selection area is determined and the entities are analyzed for an indication of a level of difficulty in selecting one of the entities. The size of the selection area is reduced when the indication implies that the level of difficulty will be decreased after reducing the size of the selection area.

20 Claims, 4 Drawing Sheets

(56) References Cited

U.S. PATENT DOCUMENTS

| | | | |
|---|---|---|---|
| 2013/0069937 A1* | 3/2013 | Kim | G06F 3/0488 345/419 |
| 2013/0181948 A1* | 7/2013 | Sakai | G06F 3/0425 345/175 |
| 2016/0188181 A1* | 6/2016 | Smith | G06F 3/048 715/765 |

* cited by examiner

SELECTING LARGE AND SMALL ENTITIES ON A COMPUTER DISPLAY

RELATED APPLICATION(S)

This application claims the benefit of U.S. Provisional Application No. 62/095,342, filed on Dec. 22, 2014. The entire teachings of the above application(s) are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to topological faces bounded by edges. Hereinafter, the terms vertex, edge, and face will be used interchangeably with their respective, corresponding geometric entities.

A design engineer is a typical user of a 3D CAD system. The design engineer designs physical and aesthetic aspects of 3D models, and is skilled in 3D modeling techniques. While creating a CAD model the design engineer needs to select various entities using a cursor-controlled pointing device such as a mouse. To select an entity, generally, the CAD software determines which entities occupy an area beneath and surrounding a cursor position using a selection vector having a certain diameter and normal to the computer screen. The diameter is large enough to enable the design engineer to select an entity without having to position the pointing device precisely over the entity. Visible entities that occupy the area beneath and surrounding the cursor position may then be ordered (e.g., in a list data structure) according to the z-value of the respective entities. The visible entity that is the closest to the user as indicated by the entity's z-value becomes the selected entity. Hereinafter the area beneath and surrounding a cursor location or a touch location will also be referred to as a selection zone and a selection area.

Often entities are small and difficult to select due to the size of the entities with respect to the modeling space. Additionally, the design engineer may want to select a vertex, an edge, or a face, all of which may occupy a small area on the computer screen making selection of any one of the entities very difficult.

A challenge CAD system designers confront is enabling the selection of edges and vertices because an edge may be only one or two pixels wide and a vertex may be a single pixel on the computer screen. To compensate for the generally smaller size of edges and vertices when compared with the size of faces, state-of-the-art CAD software selection methods first order entities in the selection area that are visible according to the entities respective z-depth; then, the top-most entities with respect to their z-depth being closer to the viewer are re-ordered so, despite respective z-values, edges and vertices are given higher selection priorities than faces, and therefore, are ordered accordingly before face entities. Thus, if the visible entities in the selection area are one edge and two faces, the edge becomes the selected entity. Essentially, the selection method assumes the user wants to select the entity that is typically more difficult to select. This method is acceptable until a situation arises in which the design engineer wants to select a small face that is surrounded by the higher-priority edges and vertices. For large faces, the user simply moves the cursor so an edge or a vertex entity is no longer in the selection zone. However, for some faces the display of the face may only be a few pixels in size in one or more dimensions, which precludes the user from selecting the face when edges are given priority in the selection order. To select the small face, the user may need to zoom into the modeling space, use an in-place magnification technique (meaning a magnifying glass function increases the apparent size of entities within a region of the display), or select from a list of entities occupying the selection zone.

A zoom approach to selecting small objects on a computer screen may display a magnifying glass icon or a +/−symbol to enable the user to zoom into a portion of the modeling space to magnify one or more objects occupying that space. As an example, when the object is a small face, zooming in on the object enables the user to more easily move his or her mouse over the small face where the selection area will not intersect an edge or a vertex of the small face. A disadvantage of this zoom approach is that designing a model while continually zooming in on and out of objects in the model is an inefficient, a cumbersome, and a time-consuming way to design a CAD model. The change in view can also be disorienting to the user and interrupt the user's desired workflow of selecting entities by interjecting zoom in and zoom out steps in the middle of the workflow.

Another approach to selecting an object that is small, obscured, or otherwise hard to select is to display a list of entities situated in the selection zone. SOLIDWORKS® 2014 software, available from Dassault Systemes SolidWorks Corporation of Waltham, Mass., displays such a list and enables a user to remove from the display screen items selected from the list making it easier to discern an entity of interest. The SOLIDWORKS® software user may also select a particular item from the list. Further, as is described in U.S. Pat. No. 7,694,238 to Gibson et al, a user may simply pick an object directly to remove that object and be able to pick another object nearby or beneath the object that was removed.

The selection of entities is one of the most common actions a user performs when working on a CAD system and on other computer systems as well. A method incorporated into a CAD system that makes the task of selecting an object less cumbersome and time consuming would enhance the capabilities of such a CAD system.

SUMMARY OF THE INVENTION

In general, in one aspect, embodiments of the invention feature a computer-implemented method for automatically adjusting the size of a selection area to aid in a selection of an object generated by a computerized system. The method detects a series of movements of a pointer, where the pointer is utilized to select an entity of the object and the series of movements are small and continuous. A set of entities that occupies the selection area is determined and the entities are analyzed for an indication of a level of difficulty in selecting one of the entities. The size of the selection area is reduced when the indication implies that the level of difficulty will be decreased after reducing the size of the selection area.

Other embodiments include a computer-aided design (CAD) system having a processor operatively coupled to a data storage system and a data storage memory operatively coupled to the processor. In such embodiments, the data storage system stores a three-dimensional model, and the data storage memory comprises instructions to configure the processor to detect a series of small, consecutive movements of a pointer used to select an entity of an object displayed on a computer screen, determine a set of entities that occupy a selection zone, analyze the entities for an indication of a level of difficulty in selecting one of the entities, and reducing the size of the selection zone when the indication implies that the level of difficulty will be decreased after reducing the size of the selection zone.

Yet other embodiments include a non-transitory computer-readable data storage medium comprising instructions that cause a computer to detect a series of movements of a pointer, where the pointer is utilized to select an entity of an object and the series of movements are small and continuous. Further instructions cause a the computer to determine that a plurality of entities occupies a selection zone, where the selection zone is an area beneath and surrounding the pointer and overlays the object, analyze the plurality of entities, where analyzing discovers an entity type of one or more of the plurality of entities, and reduce a size of the selection zone when the entity type of one or more of the plurality of entities implies a lessening in a level of selection difficulty after reducing the size of the selection zone.

The pointer, in embodiments of the present invention, may be a cursor having motion controlled by a cursor-controlled device, a stylus, or a finger. The stylus and the finger may each interface to a touch-sensitive device.

In embodiments of the invention detecting the series of movements comprises calculating a distance from an initial position of the pointer immediately prior to a first movement in the series and a final position of the pointer immediately after the last movement in the series. In other embodiments of the invention detecting the series of movements comprises calculating a total distance the pointer travels from a start location of a first movement in the series of movements to an ending location of a last movement in the series of movements.

Moreover, with regards to entities in the selection area, embodiments include the indication of the level of difficulty resulting from analyzing each entity type, analyzing a relationship of each entity to each other entity, and/or analyzing a selection priority of each entity. Analyzing the relationship of each entity to each other entity produces the indication implying the lessening in the level of difficulty when (a) the plurality of entities includes two edges belonging to the same face, and/or (b) the plurality of entities includes two vertices belonging to the same face. The selection priority of each entity may be pre-programmed or user-specified.

Additionally, when embodiments of the invention detect the series of movements, the invention infers that a user is attempting to select a small entity, and detection may be based on movements of the pointer and a size of each entity in the selection area.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The foregoing will be apparent from the following more particular description of example embodiments of the invention, as illustrated in the accompanying drawings in which like reference characters refer to the same objects throughout the different views. The drawings are not necessarily to scale, emphasis instead being placed upon illustrating embodiments of the present invention.

DETAILED DESCRIPTION OF THE INVENTION

The present invention enables easier overall selection of small entities by automatically adjusting the size of a selection area beneath and surrounding a cursor based on movements of the cursor and the size of objects occupying the same screen space beneath and surrounding the cursor. Additionally, the present invention may automatically adjust the size of a selection area beneath and surrounding a touch area on a touch-sensitive device based on events triggered by a stylus or a user's finger and the size of the objects occupying the same screen space beneath and surrounding the touch area. Although the present invention may refer to a cursor-controlled device (e.g., a mouse device) and selection zones beneath and surrounding a cursor, the embodiments described herein also apply to touch-sensitive devices and selection zones beneath and surrounding a touch area.

Figure 1:
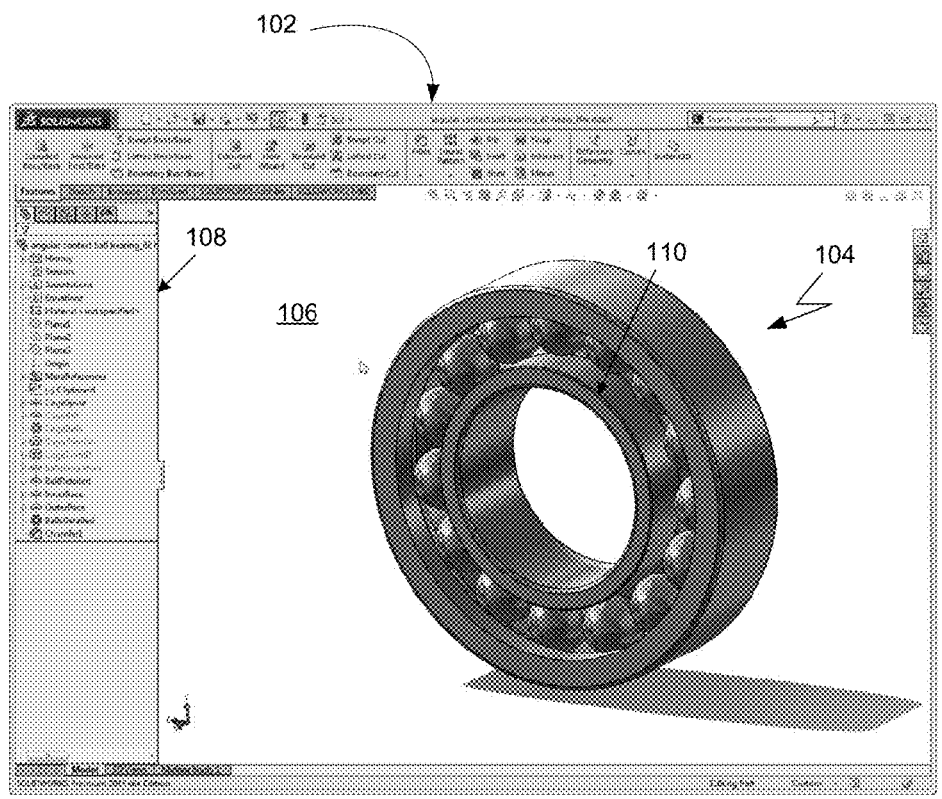
FIG. 1 is an illustration of a model displayed in a window.

Referring now to FIG. 1, a window 102 is shown, which is generated by computer-aided design (CAD) modeling software and is displayed on a computer screen. The window 102 is a conventional computer-generated window that can be programmed by one of ordinary skill in the art using conventional, commercially available, software programming tools, such as those available from Microsoft Corporation of Redmond, Wash.

A computer-generated 3D model 104 is displayed within a modeling space 106 of the window 102. A user can construct and modify the 3D model 104 in a conventional manner. The surfaces of the 3D model 104 can be displayed, or the 3D model 104 can be displayed using solid lines and dashed lines to show visible edges and hidden edges, respectively, of the 3D model 104. Implementations also may include other window areas, such as a list of features 108, which helps the user visualize and manipulate the model 104 in the modeling space 106. One such feature is a chamfered face 110 on the cylindrical edge.

Figure 2:
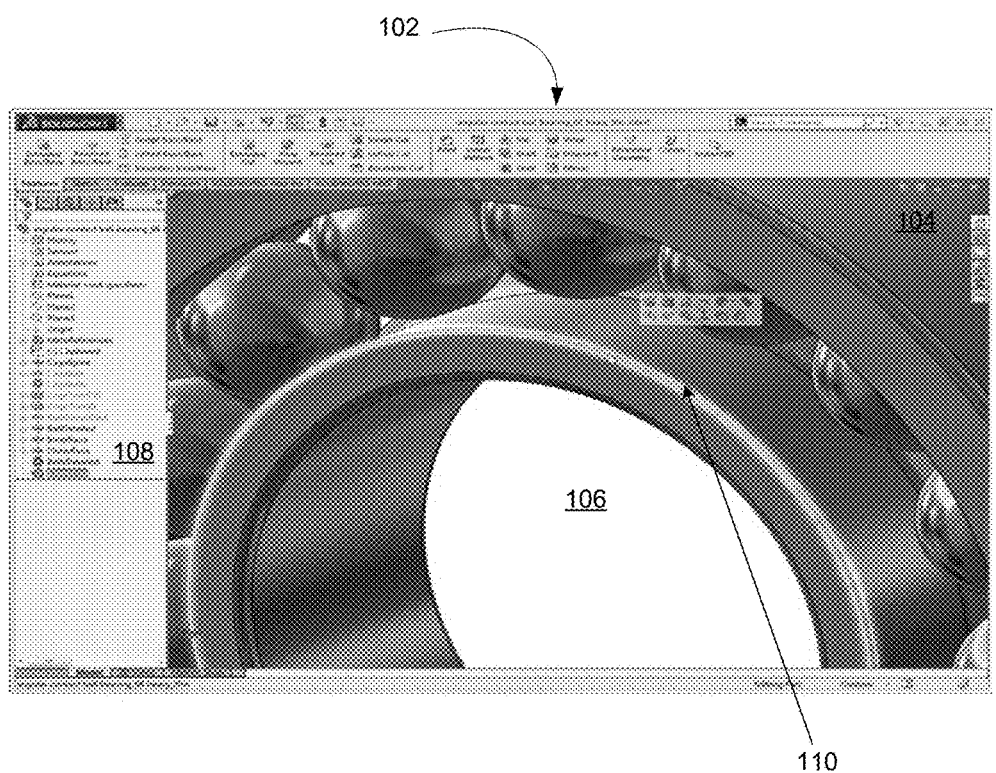
FIG. 2 is an illustration of a model displayed in a window.

FIG. 2 shows the window 102 with a clearer view of the chamfered face 110. The clearer view is achieved by zooming into the 3D model 104. As is evident to those skilled in the art, user selection of the chamfered face 110 after zooming into the 3D model 104 as shown in FIG. 2 is a much easier task than selecting the chamfered face 110 prior to zooming into the 3D model 104 as shown in FIG. 1. However, as discussed, continually zooming in on and out of objects in a model is an inefficient, a cumbersome, and a time-consuming way to design a CAD model.

The present invention aids the user in the selection process, and reduces the necessity of zooming in on and out of a model to effectuate selection. Aiding the user in the selection process includes determining that a user may be attempting to select a small entity, such as a small face. Such determination is based on movements of a cursor and the zoomed size of the objects (as seen on the screen) in the selection area. If a face appears visually small on the computer screen because of the zoom factor, then the face will be in the hit-list of items located beneath the cursor along with the adjacent edges and/or vertices. If the face appears visually large on the computer screen, then the face is easily selected by simply moving over the face. The present invention detects a sequence of small, consecutive movements initiated by a cursor-controlled device and may also establish that the cursor motion has slowed and/or the cursor is moving back and forth in a very small area on the computer screen. This could result from a user not getting the desired visual feedback (e.g., the dynamic highlighting of an entity a user wishes to select or the correct positioning of a cursor in a text string). The user in this case may be attempting to select an object that is small relative to the size of the computer screen. After detecting a sequence of small, consecutive mouse movements, the present invention analyzes the current set of objects in the selection area (also referred to as the selection zone). In an embodiment, if the present invention discovers certain types of entities in the selection area, the selection area is reduced (therefore made to have a more granular and less ambiguous effect) to enable selection of the small object.

Figure 3:
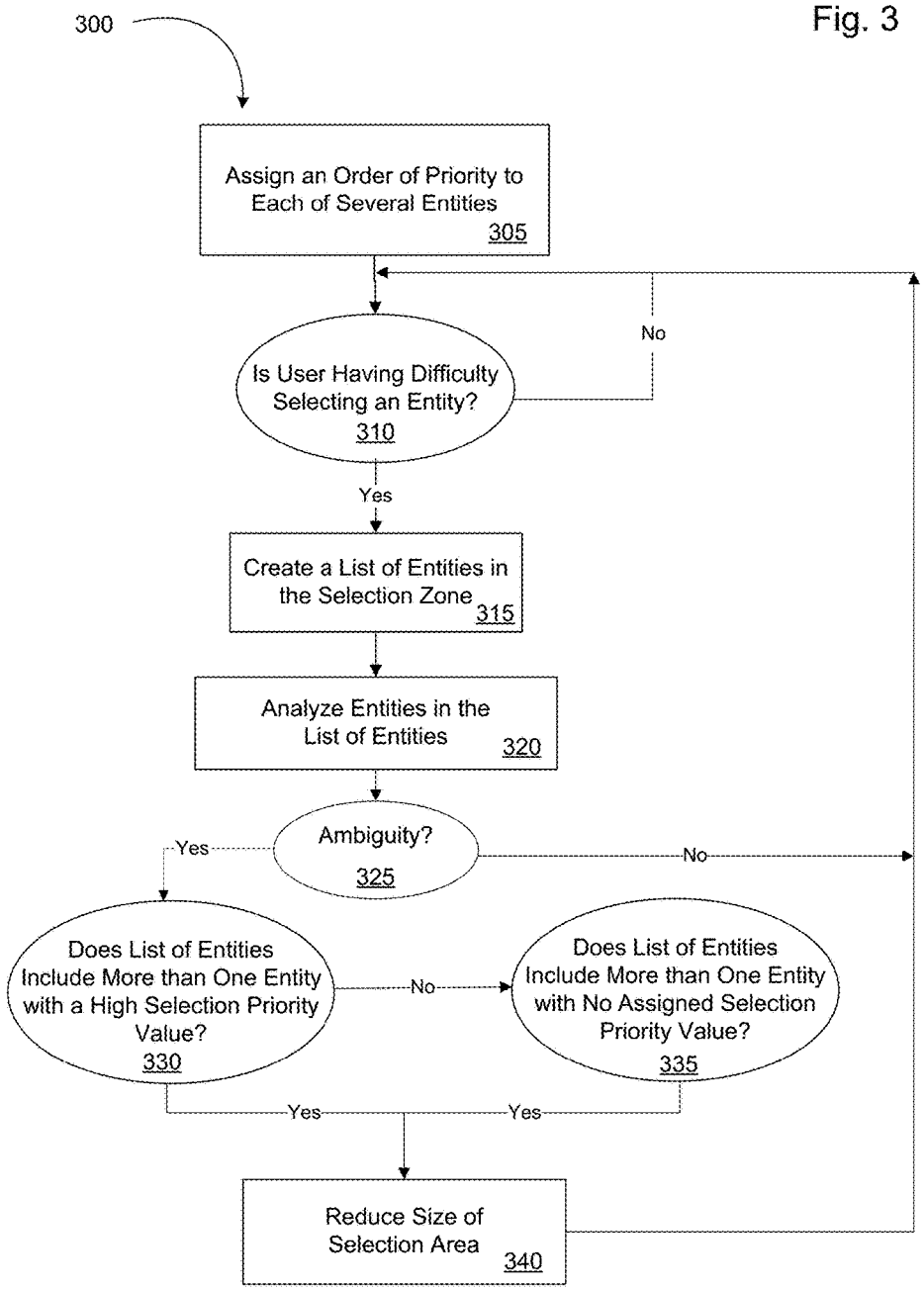
FIG. 3 is flow diagram containing steps for automatically adjusting a selection area.

Referring now to FIG. 3, an embodiment of a process for automatically adjusting a selection area is shown. In the first step, priorities are assigned to entities (step 305). A very small entity, such as a vertex that may occupy a small number of pixels (e.g., one to four pixels), may be assigned a higher selection priority than a face, which typically occupies many more pixels than a vertex. Additionally, text displayed in a menu area may be assigned a higher selection priority than the menu area in which the text is displayed. Selection priorities may be pre-programmed or user-specified (e.g., via a user interface). This first step ensures that a user can quickly select a typically sized edge or vertex and such selection is easily achievable. Assigning higher selection priorities to edges and vertices than faces makes this possible, as is the case in the prior art that has been discussed.

In the next step, process 300 determines whether a user is having difficulty selecting an entity (step 310). The detection of small, continuous cursor motions without a selection being made indicates that the user is attempting to select an entity. Detection is accomplished by computing the distance between the cursor locations of consecutive mouse events. Embodiments may, for example, determine that a user is having difficulty selecting an entity when each of five consecutive mouse events produce cursor movement of less than 10 pixels in the screen area, when together five consecutive mouse events produce cursor movement of 40 pixels in the screen area, when after three consecutive mouse events the cursor location has not strayed more than 5 pixels in the screen area from the cursor location produced by the first of the three consecutive mouse events, or any combination thereof. The number of consecutive mouse events and the number of pixels used in the calculation may be determined empirically, be user defined, and depend on the desired sensitivity of triggering the automatic adjustment of the selection area. Moreover, the distance measured in pixels will vary depending on the type of computer screen. For example, a small movement measured in metric units may traverse more pixels on a high definition computer monitor than on a lower resolution computer monitor.

Additionally, determining that a user is having difficulty making a selection may consider the speed of motion. Cursor-controlled device events may output a time value. The time lapse between such events can then be calculated and if many such events occur in a very short time period while the cursor remained within a small area during these events, the selection area may automatically be adjusted.

When process 300 determines that the user is having difficulty selecting an entity, a list of entities in the selection zone is created (step 315). (The selection zone is typically a circular or a rectangular area centered at the point of the cursor.) A technique to obtain the list of entities in the selection zone may create a vector emanating from the point of the cursor into the screen in a normal direction. All visible entities that are in or intersect with the selection zone are then included in the list of entities. Techniques to ascertain entities in a selection zone are sometimes referred to as hit testing and are known by those skilled in the art.

To aid the user in selecting an entity, process 300 analyzes the list of entities created in the previous step (step 320). Depending on the type of entities in the list, the present invention reduces the size of the selection zone (step 340). A lookup table may be accessed to compare the entity type of each entity in the list to a selection priority level. A selection priority level may be a default value or included with a definition of an object when an object is created.

In an embodiment, if the entity having the highest priority is an edge, process 300 determines if any adjacent face is also in the list. If this is the case, process 300 determines if at least one more edges belonging to that face is also in the list, and if so, the selection area is reduced because the hit testing technique with the current selection area size returned too many sibling items (e.g., two of the face's edges). This may occur when the respective face entity is also very small on the computer screen or has a very small profile at the current zoom level and orientation, in addition to being as difficult to select as an edge.

Similarly, if the entity having the highest priority is a vertex, process 300 determines if an adjacent face is also in the list and then checks for a second vertex that also belongs to that face. This is another example where the selection area is deemed too big because the list contains a face and two of the face's vertices, so the selection area is automatically reduced, which allows the user to select a lower priority item such as the face.

If the list of entities contains one entity having a low selection priority and one entity having a high selection priority, such as one face and one edge, the size of the selection zone is not adjusted because ambiguity of selection does not exist (tested in step 325). In general, selecting a low priority item (e.g., a face) is an easy action because the user can move the cursor to a position where the selection zone does not include or intersect the entity having a high selection priority (e.g., an edge). However, if the list of entities contains one entity with a low selection priority and two or more entities having high selection priorities (tested in step 330) or if not all of the entities in the list have an assigned selection priority (tested in step 335), then the selection zone is automatically decreased (step 340) because what the user is attempting to select is ambiguous. By reducing the area of the selection zone, the user can more precisely make a selection. In an embodiment, the radius of the area defining the selection zone is reduced by a factor of 8.5 times, which was determined empirically and may change from one embodiment to another.

In an embodiment, the radius of the area defining the selection zone is reduced by a factor of 8.5 times, after a first step of detecting small, continuous cursor motions and a second step of analyzing the entities in the selection zone and determining that a reduced selection zone would make selection of an entity easier. This second step is more resource intensive, and thus, only performed after detecting small, continuous cursor motions.

Examples of when reducing the selection zone is beneficial given one entity that has a low selection priority and two entities having a high selection priority are as follows. The entity having a low selection priority may be a face and the two entities having a high selection priority may be edges of the face, indicating that the face is very small because the face and two edges of the face are all in or intersect with the selection zone. Thus decreasing the selection zone allows the user to more easily select the face. Likewise, in a text editing software environment the selection zone may intersect two small widgets and a text string. The widgets may be icons indicating marked-up text, a comment, or another text editing function. If the selection zone contains or intersects the two small widgets and the text string the selection zone area is decreased to remove any ambiguity with regards to what the user is attempting to select and thereby allowing the user to more accurately make a selection.

Figure 4:
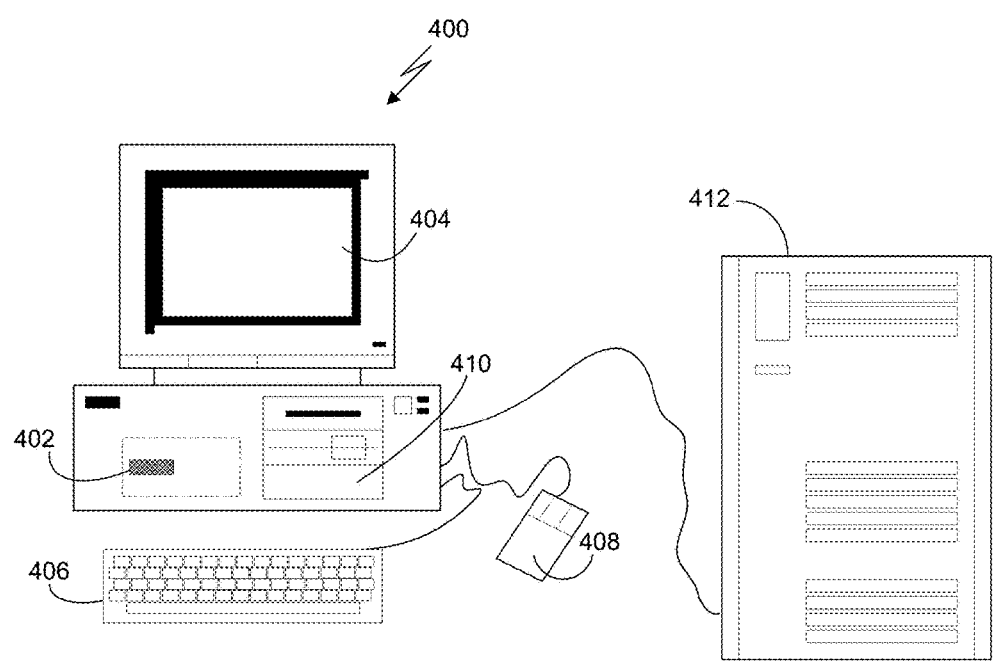
FIG. 4 is a schematic diagram of a computer system in which embodiments of the present invention may be implemented.

FIG. 4 illustrates a computerized modeling system 400 that includes a CPU 402, a computer monitor 404, a keyboard input device 406, a mouse input device 408, and a storage device 410. The CPU 402, computer monitor 404, keyboard 406, mouse 408, and storage device 410 can include commonly available computer hardware devices. For example, the CPU 402 can include an Intel-based processor. The mouse 408 may have conventional left and right buttons that the design engineer may press to issue a command to a software program being executed by the CPU 402. As an alternative or in addition to the mouse 408, the computerized modeling system 400 can include a pointing device such as a mouse, stylus, touch-sensitive pad, or pointing device and buttons built into the keyboard 406. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft Windows® 7, UNIX, Linux, or MAC OS operating systems.

Additional computer processing units and hardware devices (e.g., rapid prototyping, video, and printer devices) may be included in the computerized modeling system 400. Furthermore, the computerized modeling system 400 may include network hardware and software thereby enabling communication to a hardware platform 412, and facilitating communication between numerous computer systems that include a CPU and a storage system, among other computer components.

Computer-aided modeling software (e.g., process 300) may be stored on the storage device 410 and loaded into and executed by the CPU 402. The modeling software allows a design engineer to create and modify a 3D model and implements aspects of the invention described herein. The CPU 402 uses the computer monitor 404 to display a 3D model and other aspects thereof as described. Using the keyboard 406 and the mouse 408, the design engineer can enter and modify data associated with the 3D model. The CPU 402 accepts and processes input from the keyboard 406 and mouse 408. The CPU 402 processes the input along with the data associated with the 3D model and makes corresponding and appropriate changes to that which is displayed on the computer monitor 404 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of computer systems, environments, and/or configurations that may be suitable for use with aspects of the invention include, but are not limited to, personal computers (PCs), server computers, hand-held and laptop devices, multiprocessor systems, microprocessor-based systems, set top boxes, programmable consumer electronics, mobile telephones and mobile operating systems, network PCs, minicomputers, mainframe computers, distributed computing environments that include any of the above systems or devices, and the like. The computer system may have standalone components or workstations, or the computer system may be formed of networked computers by any of known communications networks, processing networks, cloud-based networks, related protocols and the like.

As can be appreciated, the network can be a public network, such as the Internet, or a private network such as an LAN or WAN network, or any combination thereof and can also include PSTN or ISDN sub-networks. The network can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network is merely exemplary and in no way limits the scope of the present advancements.

Advantages of the present invention include the lessening of the level of difficulty in which small entities generated by a computerized system may be selected without zoom magnification or employing secondary selection techniques (e.g., selecting an entity from a list or after removing items to better view a desired entity). Further advantages include increasing the efficiency of selecting small objects while maintaining the historic ability to quickly select entities that are typically small, such as vertices and edges. The present invention makes the task of selecting an object, which is one of the most common actions a user performs on many computerized systems, less cumbersome and time consuming.

These advantages not only may benefit CAD systems, including computer-aided drawing software systems, but also various other software systems that perform hit-testing analyses of items displayed on a computer screen (e.g., systems that enable editing of digital images, enable editing text, and systems that enable the creation of animation sequences).

A number of embodiments of the present invention have been described. Nevertheless, it will be understood by those skilled in the art that various modifications may be made within the boundaries of the invention. For example, embodiments of the present invention may change the order in which operations are performed, such as the order of priority (step 305 in FIG. 3) need not be assigned prior to steps 310 and 315 in FIG. 3. Furthermore, depending on the needs of an implementation, particular operations described herein may be implemented as a combined operation, eliminated, added to, or otherwise rearranged.

What is claimed is:

1. A computer-implemented method for automatically adjusting a size of a selection area to aid in a selection of an object generated by a computerized system, the method comprising:
    detecting a series of movements of a pointer, wherein:
        the pointer is utilized to select an entity of the object; and
        the series is formed of small and continuous movements;
    determining difficulty in selecting the entity, the difficulty is determined based on the small and continuous movements of the detected series occurring within a certain distance and without a selection being made by the pointer and;
    in response to the determined difficulty, determining that a plurality of entities occupies the selection area, wherein the selection area is an area beneath and surrounding the pointer and overlays the object;
    analyzing the plurality of entities for an indication of a level of difficulty in selecting one of the entities from the plurality of entities; and
    reducing a size of the selection area when the indication implies a lessening in the level of difficulty by reducing the size of the selection area.

2. The computer-implemented method of claim 1, wherein:
    the pointer is one of a cursor having motion controlled by a cursor-controlled device, a stylus, and a finger; and
    the stylus and the finger each interface to a touch-sensitive device.

3. The computer-implemented method of claim 1, wherein detecting the series comprises calculating a distance from an initial position of the pointer immediately prior to a first movement in the series and a final position of the pointer immediately after the last movement in the series.

4. The computer-implemented method of claim 1, wherein detecting the series comprises calculating a total distance the pointer travels from a start location of a first movement in the series to an ending location of a last movement in the series.

5. The computer-implemented method of claim 1, wherein the indication of the level of difficulty results from at least one of analyzing a type of each entity of the plurality of entities, analyzing a relationship of each entity of the plurality of entities to each other entity of the plurality of entities, and analyzing a selection priority of each entity of the plurality of entities.

6. The computer-implemented method of claim 5, wherein analyzing the relationship of each entity of the plurality of entities to each other entity of the plurality of entities produces the indication implying the lessening in the level of difficulty when at least one of (a) the plurality of entities includes two edges belonging to the same face, and (b) the plurality of entities includes two vertices belonging to the same face.

7. The computer-implemented method of claim 5, wherein the selection priority of each entity of the plurality of entities is one of pre-programmed and user-specified.

8. The computer-implemented method of claim 1, wherein:
    detecting the series infers that a user is attempting to select a small entity; and
    detecting is based on movements of the pointer and a size of each entity in a set of the plurality of entities in the selection area.

9. A computer-aided design system comprising:
    a processor operatively coupled to a data storage system, the data storage system storing a three-dimensional model; and
    a data storage memory operatively coupled to the processor and comprising instructions to configure the processor to:
    detect a series of small, consecutive movements of a pointer, the pointer utilized to select an entity of an object displayed on a computer screen;
    determine difficulty in selecting the entity, the difficulty is determined based on the small and consecutive movements of the detected series occurring within a certain distance and without a selection being made by the pointer;
    in response to the determined difficulty, determine that a plurality of entities occupies a selection zone, wherein the selection zone is an area beneath and surrounding the pointer and overlays the object;
    analyze the plurality of entities for an indication of a level of difficulty in selecting one of the entities of the plurality of entities; and reduce a size of the selection zone when the indication implies a lessening in the level of difficulty by reducing the size of the selection zone.

10. The computer-aided design system of claim 9, further comprising instructions to configure the processor to detect the series of small, consecutive movements of the pointer by calculating a distance from an initial position of the pointer immediately prior to a first movement in the series and a final position of the pointer immediately after the last movement in the series.

11. The computer-aided design system of claim 9, further comprising instructions to configure the processor to detect the series of small, consecutive movements of the pointer by calculating a total distance the pointer travels from a start location of a first movement in the series to an ending location of a last movement in the series.

12. The computer-aided design system of claim 9, further comprising instructions to configure the processor to produce the indication of the level of difficulty as a result of at least one of: analyzing a type of each entity of the plurality of entities, analyzing a relationship of each entity of the plurality of entities to each other entity of the plurality of entities, and analyzing a selection priority of each entity of the plurality of entities.

13. The computer-aided design system of claim 12, wherein the indication implies the lessening in the level of difficulty when at least one of (a) the plurality of entities includes two edges belonging to the same face, and (b) the plurality of entities includes two vertices belonging to the same face.

14. The computer-aided design system of claim 12, wherein the selection priority of each entity of the plurality of entities is one of pre-programmed and user-specified.

15. A non-transitory computer-readable data storage medium comprising instructions causing a computer to:
   detect a series of movements of a pointer, wherein:
      the pointer is utilized to select an entity of an object, and
      the series is formed of small and continuous movements;
   determine difficulty in selecting the entity, the difficulty is determined based on the small and continuous movements of the detected series occurring within a certain distance and without a selection being made by the pointer;
   in response to the determined difficulty, determine that a plurality of entities occupies a selection zone, wherein the selection zone is an area beneath and surrounding the pointer and overlays the object;
   analyze the plurality of entities, wherein analyzing discovers an entity type of one or more of the plurality of entities; and
   reduce a size of the selection zone when the entity type of one or more of the plurality of entities implies a lessening in a level of selection difficulty after reducing the size of the selection zone.

16. The computer-readable data storage medium of claim 15, further comprising instructions causing the computer to detect the series by calculating a distance from an initial position of the pointer immediately prior to a first movement in the series and a final position of the pointer immediately after the last movement in the series.

17. The computer-readable data storage medium of claim 15, further comprising instructions causing the computer to detect the series by calculating a total distance the pointer travels from a start location of a first movement in the series to an ending location of a last movement in the series.

18. The computer-readable data storage medium of claim 15, wherein an indication of the level of selection difficulty results from instructions causing the computer to at least one of analyze a relationship of each entity of the plurality of entities to each other entity of the plurality of entities and analyze a selection priority of each entity of the plurality of entities.

19. The computer-readable data storage medium of claim 18, wherein the instructions causing the computer to analyze the relationship of each entity of the plurality of entities to each other entity of the plurality of entities comprises instructions causing the computer to produce the indication implying the lessening in the level of selection difficulty when at least one of (a) the plurality of entities includes two edges belonging to the same face, and (b) the plurality of entities includes two vertices belonging to the same face.

20. The computer-readable data storage medium of claim 18, wherein the selection priority of each entity of the plurality of entities is one of pre-programmed and user-specified.

* * * * *